United States Patent
Shakkarwar

(10) Patent No.: US 6,694,492 B1
(45) Date of Patent: Feb. 17, 2004

(54) METHOD AND APPARATUS FOR OPTIMIZING PRODUCTION YIELD AND OPERATIONAL PERFORMANCE OF INTEGRATED CIRCUITS

(75) Inventor: Rajesh G. Shakkarwar, Cupertino, CA (US)

(73) Assignee: ATI International SRL (BB)

( * ) Notice: Subject to any disclaimer, the term of this patent is extended or adjusted under 35 U.S.C. 154(b) by 0 days.

(21) Appl. No.: 09/540,456

(22) Filed: Mar. 31, 2000

(51) Int. Cl.[7] .............................................. G06F 17/50
(52) U.S. Cl. ................................ 716/2; 716/7; 703/14; 700/108; 700/121
(58) Field of Search ...................... 716/2, 7; 700/108, 700/121; 703/14

(56) References Cited

U.S. PATENT DOCUMENTS

| | | | | |
|---|---|---|---|---|
| 4,295,149 | A | * 10/1981 | Balyoz et al. | 257/211 |
| 5,696,694 | A | * 12/1997 | Khouja et al. | 716/5 |
| 5,838,947 | A | * 11/1998 | Sarin | 703/14 |
| 5,987,086 | A | * 11/1999 | Raman et al. | 716/1 |
| 6,141,632 | A | * 10/2000 | Smith et al. | 703/14 |
| 6,272,666 | B1 | * 8/2001 | Borkar et al. | 716/5 |
| 6,345,379 | B1 | * 2/2002 | Khouja et al. | 716/4 |
| 6,397,170 | B1 | * 5/2002 | Dean et al. | 703/14 |
| 6,415,423 | B1 | * 7/2002 | Takahashi et al. | 716/7 |
| 6,434,704 | B1 | * 8/2002 | Dean et al. | 713/320 |
| 6,549,880 | B1 | * 4/2003 | Willoughby et al. | 703/13 |
| 2002/0073388 | A1 | * 6/2002 | Orshansky et al. | 716/5 |
| 2002/0073394 | A1 | * 6/2002 | Milor et al. | 716/19 |
| 2002/0162080 | A1 | * 10/2002 | Takahashi et al. | 716/7 |

OTHER PUBLICATIONS

Bamji et al., "Enhanced network flow algorithm for yield optimization", Proceedings of 1996 33rd Design Automation Conferenc Jun. 3, 1996, pp. 746–751.*

Meehan, "Understanding and maximising yield thorugh design centering [microwave circuits]", IEE Colloquium on Computer Based Tools for Microwave Engineers, Oct. 15, 1991, pp. 6/1–6/4.*

* cited by examiner

Primary Examiner—Vuthe Siek
Assistant Examiner—Phallaka Kik
(74) Attorney, Agent, or Firm—Vedder, Price, Kaufman & Kammholz, P.C.

(57) ABSTRACT

A method and apparatus for optimizing production yield and operational performance of integrated circuits is provided. A nominal operating voltage is used to categorize integrated circuits into a plurality of performance categories, and the nominal operating voltage is adjusted for each performance category to optimize the yield within that performance category. Integrated circuits may be operated at different operating rates according to their performance categories. The operating rates of an integrated circuit may be controlled by programming a clock register for the integrated circuit. Correct programming of the clock register may be assured by programming a one-time-programmable device. A one-time-programmable device may also be used to program the nominal operating voltage once the optimal nominal operating voltage has been determined. A diagnostic program may be used to select optimum performance parameters for an integrated circuit. To determine changes in performance, one of the performance parameters is changed, test vectors are applied to the integrated circuit core, and responses from the integrated circuit core are verified. Alternatively, parameters may be obtained from a look-up table. Changes in power dissipation may be determined by monitoring a thermal sensor. Testing may be performed in a temperature-controlled environment or in an operational environment. A test controller may be used to implement the testing. Power dissipation of an integrated circuit may be controlled by controlling performance parameters of the integrated circuit. The power dissipation may be controlled to limit power consumption, for example, to extend battery life, or to prevent an integrated circuit from overheating.

9 Claims, 8 Drawing Sheets

METHOD AND APPARATUS FOR OPTIMIZING PRODUCTION YIELD AND OPERATIONAL PERFORMANCE OF INTEGRATED CIRCUITS

TECHNICAL FIELD OF THE INVENTION

The invention relates generally to semiconductor integrated circuits and more specifically to management of performance parameters of integrated circuits.

BACKGROUND OF THE INVENTION

Ideally, semiconductor manufacturing processes would produce perfectly identical semiconductor devices. However, impurities and process variations result in semiconductors devices, even those from the same wafer, having different characteristics. An example of the different characteristics include differences in timing characteristics. Variations in timing characteristics result in different operating speeds for the components. Integrated circuit producers typically grade integrated circuits in different speed categories, or "bins," and sell them as different components at different prices. The high-speed parts are typically sold at a higher price. Computer manufacturers buy different "bin" CPUs at different prices and offer them in models with different price points, e.g., PCs based on PENTIUM III 550 MHz CPUs are sold at a higher price than the ones based on PENTIUM III 500 MHz CPUs.

To reduce the manufacturing and inventory issues, computer manufacturers use the same mother boards for end products based on these different speed CPUs. A clock generator on the motherboard generates a fixed frequency clock that is fed to the CPU. The CPU has an internal register that determines a multiplier ratio between the external clock frequency and the CPU core frequency. Computer manufacturers, at the time of system integration, program the system with the correct multiplier to run the CPU core at its rated speed.

This approach has several problems. Firstly, the additional step involved in programming the system increases the manufacturing cost. Secondly, rouge computer manufacturers can and do over-clock systems and sell computers based on lower speed "bin" CPUs as if they were based on higher speed "bin" CPUs. This compromises the system integrity, as well as harming CPU manufacturers. Thirdly, gray market peddlers re-stamp parts as high speed parts. Thus, integrated circuits, as currently configured, suffer from many disadvantages.

Another shortcoming of integrated circuits and the systems in which they are used is that they are typically configured to operate at fixed performance and power dissipation levels and cannot be dynamically altered. These fixed performance and power dissipation levels can result in undesirable effects on other operating parameters. Such integrated circuits and systems are incapable of dynamically adapting the performance and power dissipation levels to be more suitable for the manner in which users are using the integrated circuits and systems.

Another problem that arises as more processing capability is built into integrated circuits is that the power dissipated by the integrated circuits increases. Traditional techniques for allowing integrated circuits to operate with increased power dissipation include the use of heat sinks, fans, and thermoelectric cooling devices to cool the integrated circuits. Heat sinks are bulky and add to the cost of the systems. Fans decrease reliability by introducing a moving part and increase audible noise from the system, as well as increasing cost and complexity and reducing battery life for battery-operated systems. Thermoelectric cooling devices are expensive, consume large amounts of power, generate additional heat, and reduce battery life for battery-operated systems. Thus, traditional thermal management techniques introduce additional complications and costs and are constrained in their effectiveness.

In summary, traditional techniques for producing and operating integrated circuits and systems in which they are incorporated have substantial drawbacks. Moreover, such drawbacks tend to be exacerbated by the manner in which modern integrated circuits and systems are used, for example, in battery-operated systems and in general-purpose computing systems capable of performing a great number of widely varied applications.

DETAILED DESCRIPTION OF A PREFERRED EMBODIMENT

Figure 1:
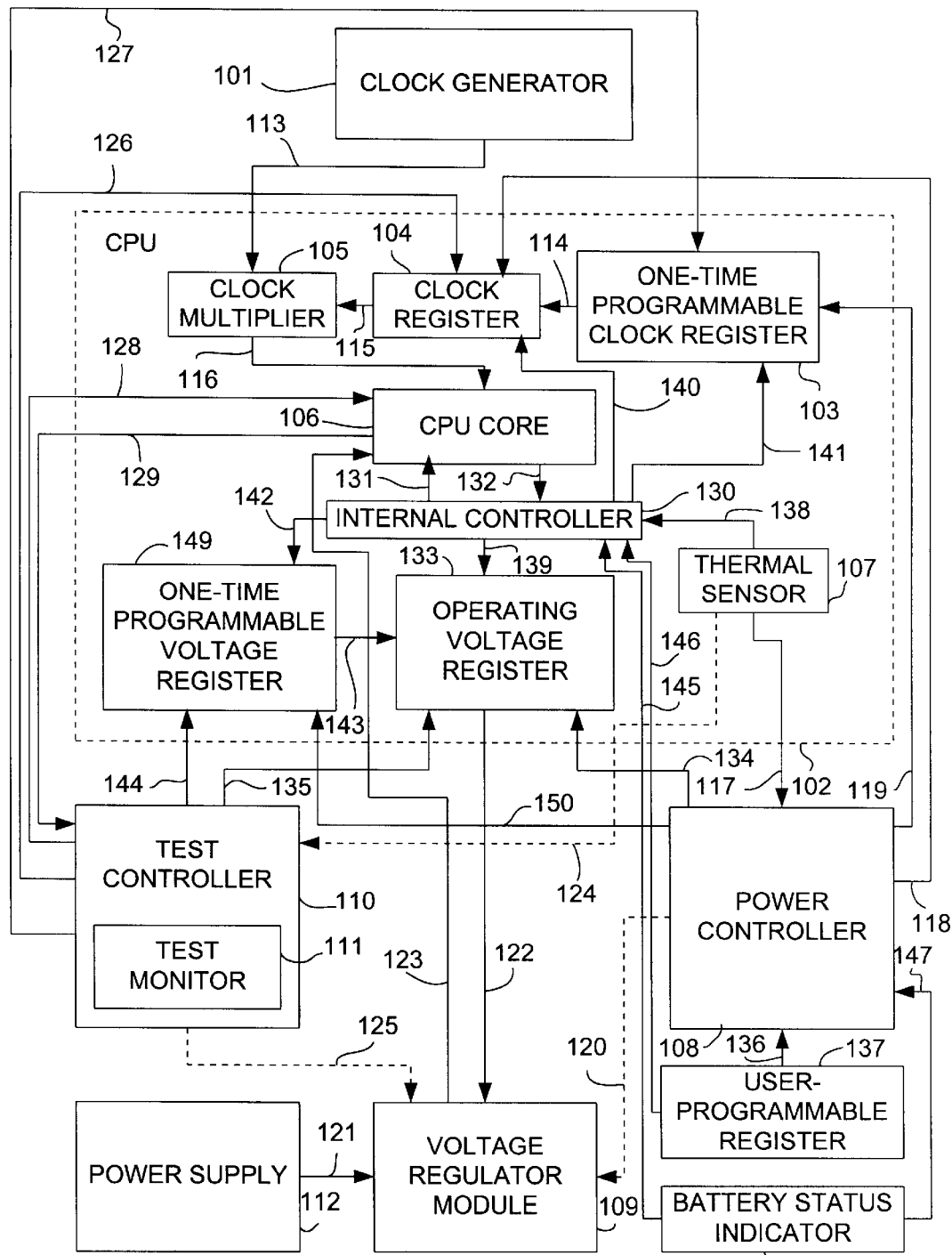
FIG. 1 is a block diagram illustrating an embodiment of the present invention.

A method and apparatus for optimizing production yield and operational performance of integrated circuits is provided in accordance with the invention. A nominal operating voltage is used to categorize integrated circuits into a plurality of performance categories, and the nominal operating voltage is adjusted for each performance category to optimize the yield within that performance category. Integrated circuits may be operated at different operating rates according to their performance categories. The operating rate of an integrated circuit may be controlled by programming a clock register for the integrated circuit. Correct programming of the clock register may be assured by programming a one-time-programmable device. A one-time-programmable device may also be used to program the nominal operating voltage once the optimal nominal operating voltage has been determined.

The invention may be used in conjunction with a diagnostic program to select optimum performance parameters for an integrated circuit. To determine changes in performance, one of the performance parameters is changed, test vectors are applied to the integrated circuit core, and responses from the integrated circuit core are verified. Changes in power dissipation and operation within thermal parameters may be determined by monitoring a thermal sensor. Testing may be performed in a temperature-controlled environment or in the operational environment of a system. A test controller may be used to implement the testing, or the test controller may be incorporated within an integrated circuit.

The invention may be used to control power dissipation of an integrated circuit. The power dissipation may be controlled to limit power consumption, for example, to extend battery life, or to prevent an integrated circuit from overheating. Power dissipation may be determined by monitoring a thermal sensor, for example, a diode junction, incorporated into the integrated circuit. The operating voltage of the integrated circuit may be changed based on the power dissipation. The operating voltage may be changed by programming a new value into an operating voltage register. The operating rate of the integrated circuit may be changed based on the change in operating voltage. The operating rate may be changed by programming a new value into a clock register. User input may be obtained to determine the desired operating rate, for example by reading a user-programmable register. The user-programmable register may be programmed by an application according to an application program interface to indicate to the system the desired performance and power dissipation level. To extend battery life, battery characteristics, for example, the battery voltage, may be monitored, and the operating voltage and operating rate of the integrated circuit changed according to the monitored battery characteristics.

In accordance with the invention, configuration of an integrated circuit may be performed automatically, both avoiding additional steps in the configuration process and preventing misrepresentation of component ratings. Computer manufacturers may use a single motherboard for different CPU "bins," and, when a CPU is inserted in the CPU socket, the CPU core will automatically run at its rated clock speed. This removes the manual steps required by computer manufacturers as well as completely eliminates the over-clocking problem.

One way to provide the desired benefits is for the CPU to incorporate a one-time-programmable clock register and/or a one-time-programmable voltage register. The clock generator on the motherboard provides a clock signal to the one-time-programmable clock register. An output of the one-time-programmable clock register provides an adjusted clock signal to the CPU core. The one-time-programmable voltage register communicates the desired core voltage value to an external voltage regulator module, which supplies an appropriate core voltage to the CPU core.

Fusible links, or "fuses," may be used to implement the one-time-programmable clock register and/or the one-time programmable voltage register. The register is programmed at the time the CPU die is tested. CPU dies are tested for their functionality during the final stages of manufacturing process. One of the steps performed during the final stages is to correct the internal SRAMs by blowing fuses. In accordance with the invention, additional steps may be performed. The die may be "speed-binned" (i.e., categorized into one of several bins according to the maximum operating speed of which it is capable) before the SRAM correction process. Based on the "speed bin" of the die, the appropriate one-time-programmable clock register fuses and/or one-time-programmable voltage register fuses are blown during the SRAM correction process. This step will fix the clock multiplier to the correct value resulting in the CPU core being fixed to operate at its rated core clock frequency. This step will also fix the operating voltage indication provided to the voltage regulator module to a value that will result in the appropriate voltage being applied to the CPU core. Consequently, when a CPU is plugged into a motherboard, the CPU core will automatically run at the rated frequency and the appropriate voltage. The values programmed in the one-time-programmable clock register and/or the one-time-programmable voltage register may be selected to provide the optimum yield in the production of CPUs. This technique may also be applied to devices other than CPUs.

An embodiment of the invention may be used to optimize operational performance of integrated circuits. For example, an internal controller may be incorporated within an integrated circuit to adjust an operational voltage of the integrated circuit, adjust an operating rate of the integrated circuit, apply test vectors to the integrated circuit, and assess the response of the integrated circuit to the test vectors. The test vectors may include input signals, input data, program code, or other inputs to the integrated circuit intended to result in a predictable response from the integrated circuit. If the integrated circuit responds appropriately to the test vectors, proper operation of the integrated circuit can be verified. Multiple test vectors may be applied to test multiple functions or sub-components of the integrated circuit. Multiple tests may be conducted to assess the characteristics of the integrated circuit under varying conditions.

A thermal sensor may be used to monitor thermal parameters of the integrated circuit, with the thermal parameters being used to adjust the operational voltage or operating rate of the integrated circuit or to assess the response of the integrated circuit to test vectors. Thermal management may be effected by adjusting the operational voltage and/or operating rate of an integrated circuit to control thermal parameters, thereby obviating the need for traditional cooling devices, such as heat sinks, fans, and/or thermoelectric devices.

An embodiment of the invention may be used to optimize power consumption of integrated circuits. For example, the invention may be applied to battery-operated systems to extend useful battery life. As a battery is discharged, the remaining charge of the battery may be determined, for example, by measuring the battery voltage or by integrating the discharge rate over time. As the remaining charge of the battery declines, an embodiment of the invention may be used to adjust operating parameters, for example, the operating voltage and/or operating rate of devices in the system to reduce the power consumption of the devices. By reducing the power consumption as the battery charge declines, the useful operating time of the battery may be extended. A thermal sensor may be used to monitor the power dissipation of a device and provide feedback in the control of the power consumption.

Once operating parameters that provide proper operation of device are determined, whether by application of test vectors, monitoring of a thermal sensor, or adjustment based on battery status or other factors, these operating parameters may be stored in memory, for example, in a look-up table, and subsequently used without the need for verification of proper operation. Alternatively, if such operating parameters are known at the time of manufacture, a look-up table may be provided at that time. The look-up table may include additional information, for example, information to help select the optimal value from the look-up table for a particular set of operating conditions. The look-up table may be stored in any suitable type of memory, for example, read-only memory (ROM), one-time-programmable memory, non-volatile memory, or volatile memory. The memory may be included within an integrated circuit or external to the integrated circuit.

FIG. 1 is a block diagram illustrating an embodiment of the present invention. This embodiment of the invention includes a clock generator 101, a central processing unit 102, a power controller 108, a test controller 110, a voltage regulator module 109, a power supply 112, a user-programmable register 137, and a battery status indicator 148. The clock generator 101 is coupled to the central processing unit 102. The central processing unit 102 includes a one-time-programmable clock register 103, a clock register 104, a clock multiplier 105, a central processing unit core 106, an internal controller 130, a one-time programmable voltage register 149, an operating voltage register 133, and a thermal sensor (for example, a diode junction) 107.

Clock generator 101 provides a clock signal 113 to clock multiplier 105. One-time-programmable clock register 103 provides a value 114 to clock register 104. Clock register 104 may be programmed using the value 114 from one-time-programmable clock register 103 or from another source. The value 115 stored in clock register 104 is provided to clock multiplier 105 and controls the multiplication factor of clock multiplier 105. Thus, clock multiplier 105 converts the clock signal 113 to a core clock signal 116 that controls the operating rate of central processing unit core 106.

A voltage regulator module 109 is coupled to the central processing unit 102. The central processing unit 102 includes an operating voltage register 133. The operating voltage register 133 provides an operating voltage indication to voltage regulator module 109. The operating voltage indication 122 is provided from central processing unit 102 to voltage regulator module 109. This may be accomplished by bringing the operating voltage register values out on pins of the integrated circuit package. Alternatively, the pins may be strapped in a configuration to provide the desired operating voltage indication. Voltage regulator module 109 sets a correct operating voltage based on the operating voltage indication 122 and converts an input voltage 121 from power supply 112 to the correct operating voltage 123 provided to central processing unit core 106 or other circuits of central processing unit 102.

A power controller 108 is coupled to the central processing unit 102, the voltage regulator module 109, to a user-programmable register 137, and to battery status indicator 148. The thermal sensor 107 in the central processing unit 102 provides an output 117 to the power controller 108. A user-programmable register 137 provides an output 136 to power controller 108. Power controller 108 uses outputs 117, 136, and 147 from the thermal sensor 107, user-programmable register 137, and battery status indicator 148, respectively, to provide a voltage control signal 120 to voltage regulator module 109 and an operating rate control signal 118 to clock register 104.

The power controller 108 can use the operating voltage control signal 120 to control the operating voltage 123 supplied to central processing unit core 106. Power controller 108 can use the operating rate control signal 118 to control the operating rate of central processing unit 102, including the operating rate of central processing unit core 106. The operating voltage and operating rate of the central processing unit 102 may be controlled in response to power dissipation determined by monitoring thermal sensor 107 or based on an external user input using user-programmable register 137. Power controller 108 may also be coupled to one-time programmable clock register 103 to program a value 119 and to a one-time programmable voltage register 149 to program a value 150. The power controller 108 may program the one-time-programmable clock register 103 and/or the one-time-programmable voltage register 149.

Power controller 108 can program operating voltage register 133 with a value 134. The value 134 can be used to alter the operating voltage indication 122 provided to voltage regulator module 109. Consequently, voltage regulator module 109 responds by changing the operating voltage 123 applied to central processing unit core 106.

A test controller 110, including a test monitor 111 may be coupled to central processing unit 102 and voltage regulator module 109. The test controller 110 provides a operating rate control signal 126 to clock register 104 or a value 127 to one-time programmable clock register 103. The test controller 110 provides an operating voltage control signal 125 to voltage regulator module 109. The test controller 110 applies test vectors 128 to central processing unit core 106. The test monitor receives responses 129 from central processing unit core 106 and verifies that the responses are proper.

As the test controller varies the operating rate control signal 126 and/or the operating voltage control signal 125, it can verify proper operation of central processing unit core 106 by applying test vectors 128 and receiving verification from test monitor 111 as to the accuracy of responses 129. Test controller 110 may also monitor a signal 124 from thermal sensor 107 to assess thermal characteristics of central processing unit 102. Test controller 110 may be coupled to operating voltage register 133 of central processing unit 102 to program an appropriate operating voltage indication 135 for central processing unit 102. Test controller 110 may program a value 144 into a one-time-programmable voltage register 149. The value 143 stored in one-time-programmable voltage register 149 can be loaded into operating voltage register 133 to determine the operating voltage indication 122 provided to voltage regulator module 109.

Test controller 110 can program operating voltage register 133 with a value 135. The value 135 can be used to alter the operating voltage indication 122 provided to voltage regulator module 109. Consequently, voltage regulator module 109 responds by changing the operating voltage 123 applied to central processing unit core 106.

Central processing unit 102 may also include an internal controller 130. Internal controller 130 may receive an output 138 from thermal sensor 107. Internal controller 130 may receive an input 145 from battery status indicator 148. Internal controller 130 may receive an input 146 from user-programmable register 137. The internal controller 130 may apply test vectors 131 controlled by a diagnostic program to central processing unit core 106. The internal controller 130 may use the diagnostic program to verify responses 132 from central processing unit 106.

Based on determinations of the diagnostic program, the internal controller 130 can program clock register 104 with a value 140 or, optionally, can program one-time programmable clock register 103 with a value 141. The internal controller 130 can also program an operating voltage indication 139 into operating voltage register 133, or, optionally, can program one-time-programmable voltage register 149 with a value 142. Internal controller 130 may perform these programming functions in response to user input to user-programmable register 137, in response to battery status from battery status indicator 148, and/or in response to other inputs or conditions. The diagnostic program may be on the integrated circuit or stored externally.

Figure 2:
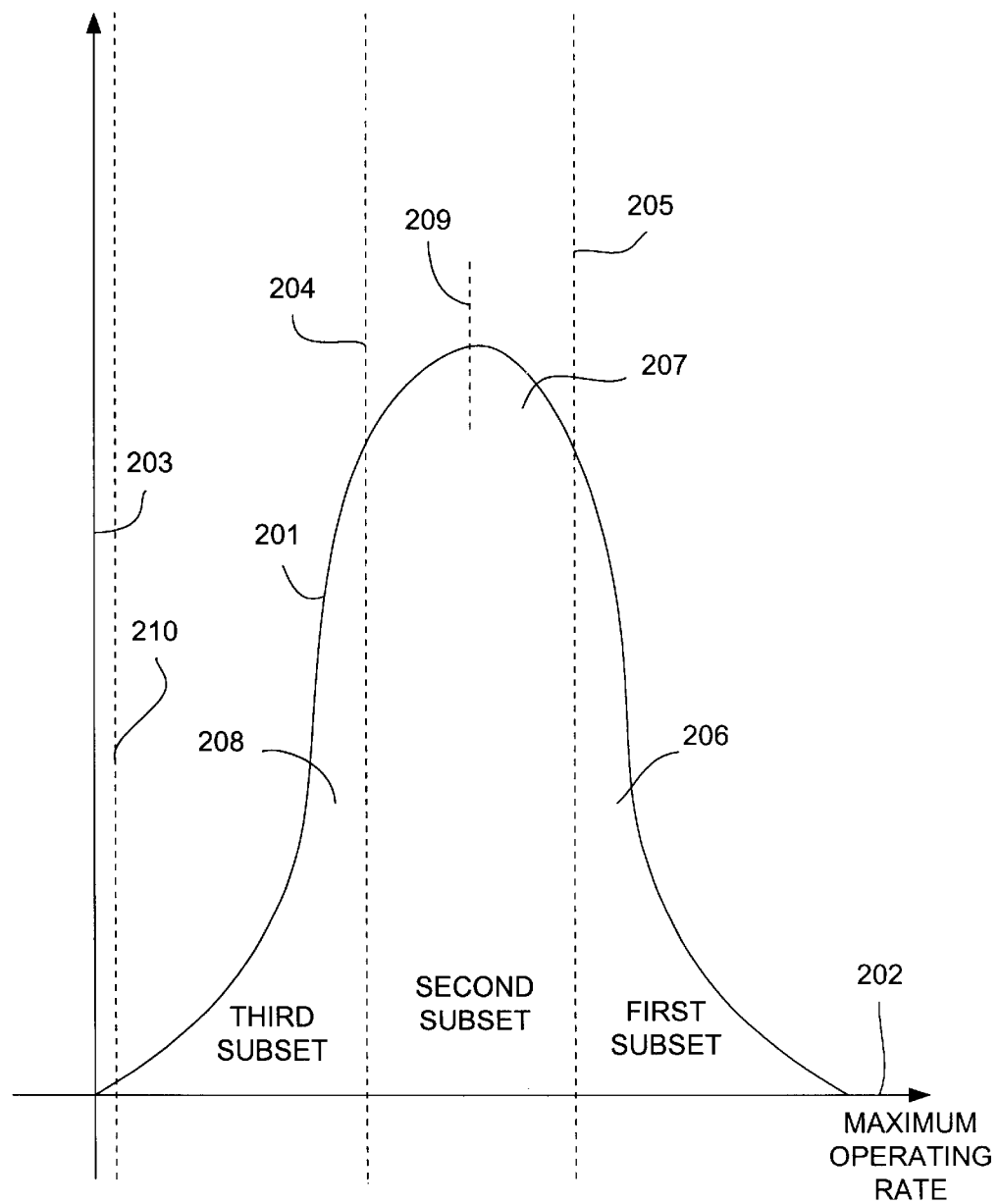
FIG. 2. is a graph illustrating a distribution of maximum operating rates for integrated circuits.

FIG. 2 is a graph illustrating a distribution of maximum operating rates for integrated circuits. Since semiconductor process variations prevent every integrated circuit produced from being exactly identical, some integrated circuits are capable of operating at higher rates than other integrated circuits. While some integrated circuits may operate at the average operating rate 209, others may operate at a higher maximum operating rate or a lower maximum operating rate, as illustrated by curve 201. The maximum operating rate is illustrated along axis 202, and the number of integrated circuits is illustrated along axis 203.

The integrated circuits may be binned into several performance categories, for example, to increase the number of usable integrated circuits produced or to increase the yield for higher performance circuits. A first subset 206 of the integrated circuits may be categorized in a first performance category, while a second subset 207 of the integrated circuits may be categorized in a second performance category, and a third subset 208 of the integrated circuits may be categorized in a third performance category. Since the first subset of integrated circuits all have a maximum operating rate greater than or equal to operating rate 205, the first subset 206 of integrated circuits may be designated to be operated at operating rate 205. Likewise, since all of the second subset 207 of integrated circuits have a maximum operating rate greater than or equal to operating rate 204, the second subset 207 of the integrated circuits may be designated to operate at operating rate 204. Since the third subset 208 of integrated circuits has a maximum operating rate greater than or equal to operating rate 210, the third subset 208 of integrated circuits may be designated to operate at operating rate 210.

Figure 3:
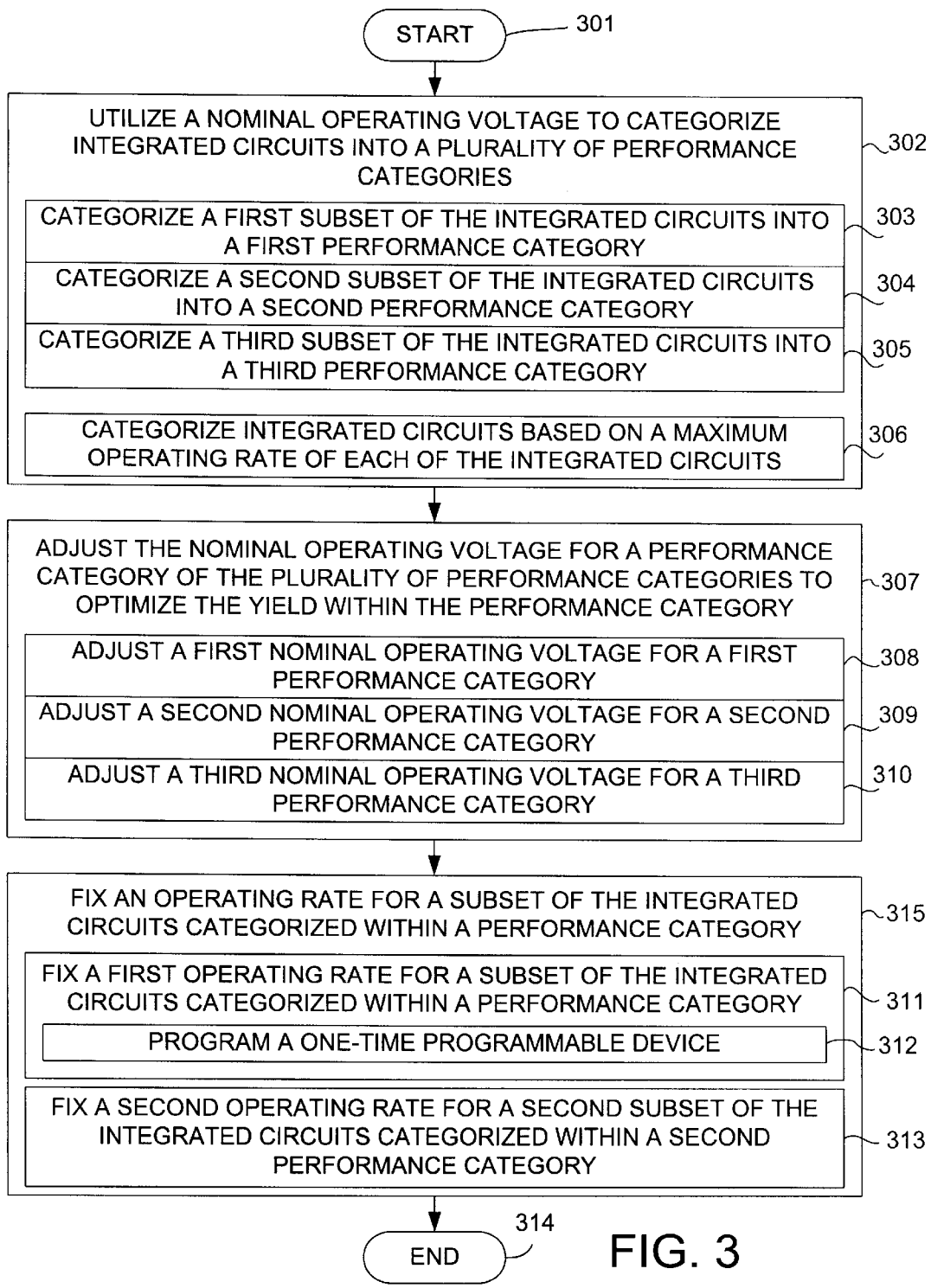
FIG. 3. is a flow diagram illustrating a method according to one embodiment of the present invention.

FIG. 3 is a flow diagram illustrating a method according to one embodiment of the present invention. The method begins in step 301 and continues to step 302. In step 302, a nominal operating voltage is utilized to categorize the integrated circuits into a plurality of performance categories. A set of nominal operating voltages may be used for this categorization. Specific values of other operating parameters, for example, clock rate, current, set-up time, hold time, clock jitter, noise, etc., may be associated with each of the nominal operating voltages in the set of nominal operating voltages. Step 302 may include steps 303, 304, and 305. Alternatively, step 302 may include step 306. In step 303, the nominal voltage is utilized to categorize a first subset of the integrated circuits into a first performance category, wherein the integrated circuits categorized in the first performance category are capable of operating at a first performance category specified operating rate. In step 304, the nominal operating voltage is utilized to categorize a second subset of the integrated circuits into a second performance category, wherein the integrated circuits categorized in the second performance category are capable of operating at a second performance category specified operating rate. Typically, certain operating rates are specified for certain integrated circuits. If, for example, the second performance category specified operating rate is specified for an integrated circuit, the first performance category specified operating rate may be higher than the second performance category specified operating rate and may allow the integrated circuit to operate at an operating rate greater than the operating rate specified for the integrated circuit.

In step 305, the nominal voltage is utilized to categorize the third subset of the integrated circuits into a third performance category, wherein the integrated circuits categorized in the third performance category are capable of operating at a third performance category specified operating rate. The third performance category specified operating rate may be lower than the second performance category specified operating rate. Thus, it may require the integrated circuit to operate at an operating rate lower than the operating rate specified for the integrated circuit. Integrated circuits may be categorized into additional performance categories beyond the first, second, and third performance categories, if desired. In step 306, the nominal operating voltage is utilized to categorize the integrated circuits into a plurality of performance categories based on a maximum operating rate of each of the integrated circuits. The maximum operating rate may be an absolute maximum operating rate that is the upper limit of operating rates that provide proper operation of the integrated circuit, or it may be a lower operating rate to provide a safety margin to ensure proper operation of the integrated circuit even when other influences on the integrated circuit would tend to further constrain the operating rate.

From step 302, the process continues to step 307. Optionally, step 307 may be omitted, with the process continuing to step 315. In step 307, the nominal operating voltage is adjusted for a performance category of the plurality of performance categories to optimize the yield within that performance category. Step 307 may include steps 308, 309 and 310. In step 308, a first nominal operating voltage is adjusted for a first performance category. In step 309, a second nominal operating voltage is adjusted for a second performance category. In step 310, a third nominal operating voltage is adjusted for a third performance category.

From step 307, the process continues to step 315. In step 315, an operating rate is fixed for a subset of the integrated circuits categorized within a performance category. The subset may include all of the integrated circuits categorized within a performance category or fewer. Step 315 may includes steps 311 and 313. In step 311, a first operating rate is fixed for the first subset of the integrated circuits categorized within a first performance category of the plurality of performance categories. Step 311 may include step 312. In step 312, a one-time programmable device, for example, a one-time-programmable clock register, is programmed according to the first operating rate. A one-time-programmable voltage register may also be programmed to provide operation at a voltage compatible with the first operating rate. From step 311, the process continues to step 313. In step 313, a second operating rate is fixed for a second subset of the integrated circuits categorized within a second performance category of the plurality of performance categories. Additional operating rates for the additional subsets of the integrated circuits may also be fixed. The process ends in step 314.

The set of nominal operating voltages used, along with the operating rates, may be based on statistical analysis of actual yields and performance measurements of integrated circuits for a particular process used and a particular design. Thus, for example, if a particular operating voltage is statistically identified to maximize the yield of integrated circuits categorized into the second performance category, that particular operating voltage may be used as the nominal operating voltage for categorizing additional integrated circuits into the second performance category.

Figure 4:
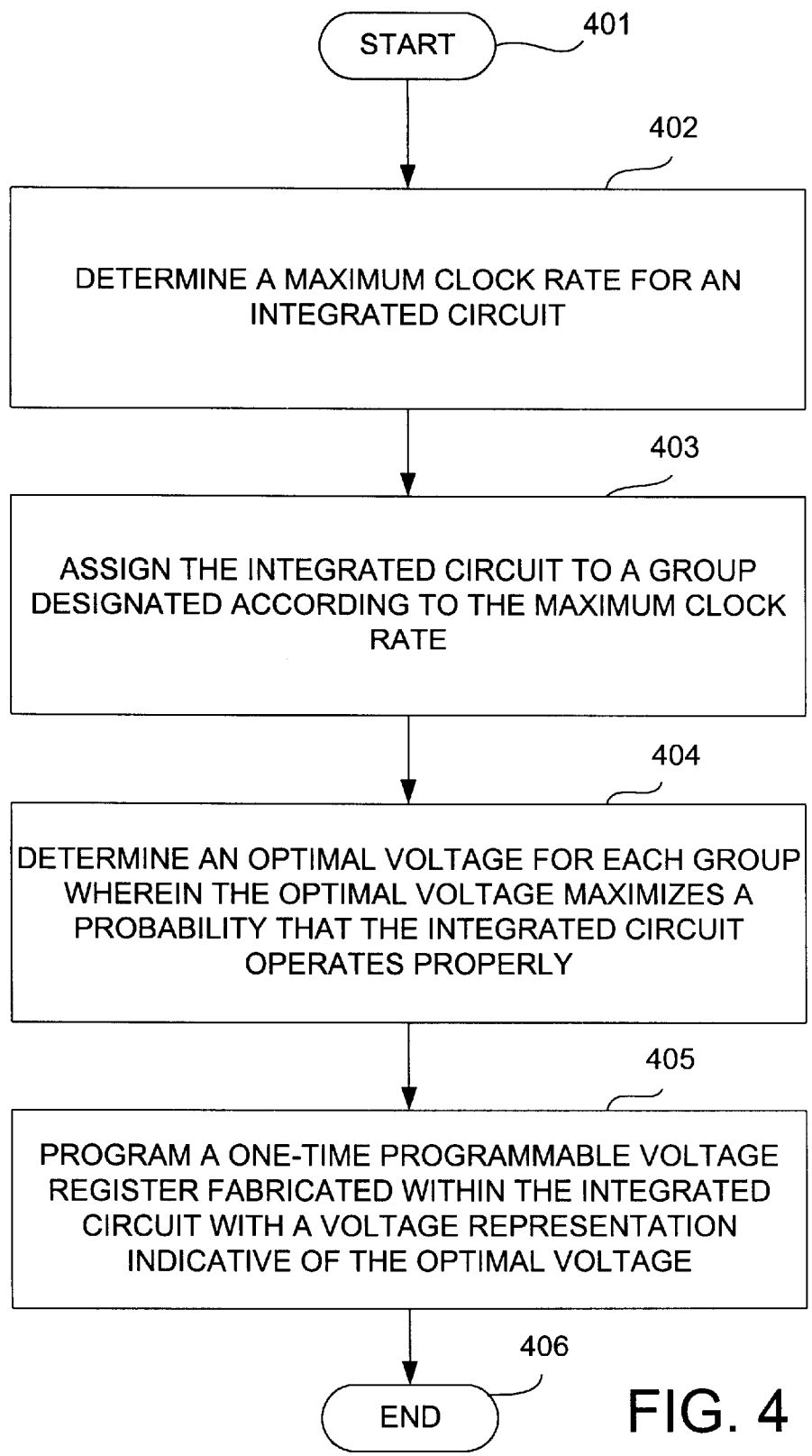
FIG. 4. is a flow diagram illustrating a method according to an embodiment of the present invention.

FIG. 4 is a flow diagram illustrating a method according to an embodiment of the present invention. The method begins in step 401 and continues in step 402. In step 402, a maximum clock rate is determined for an integrated circuit. In step 403, the integrated circuit is assigned to a group designated according to the maximum clock rate. In step 404, an optimal voltage is determined for each group, wherein the optimal voltage maximizes a probability that the integrated circuit operates properly. It is usually desirable to use an optimal voltage that ensures that the integrated circuit operates properly. In step 405, a one-time programmable voltage register fabricated within the integrated circuit is programmed with a voltage representation indicative of the optimal voltage. The process ends in step 406.

Figure 5:
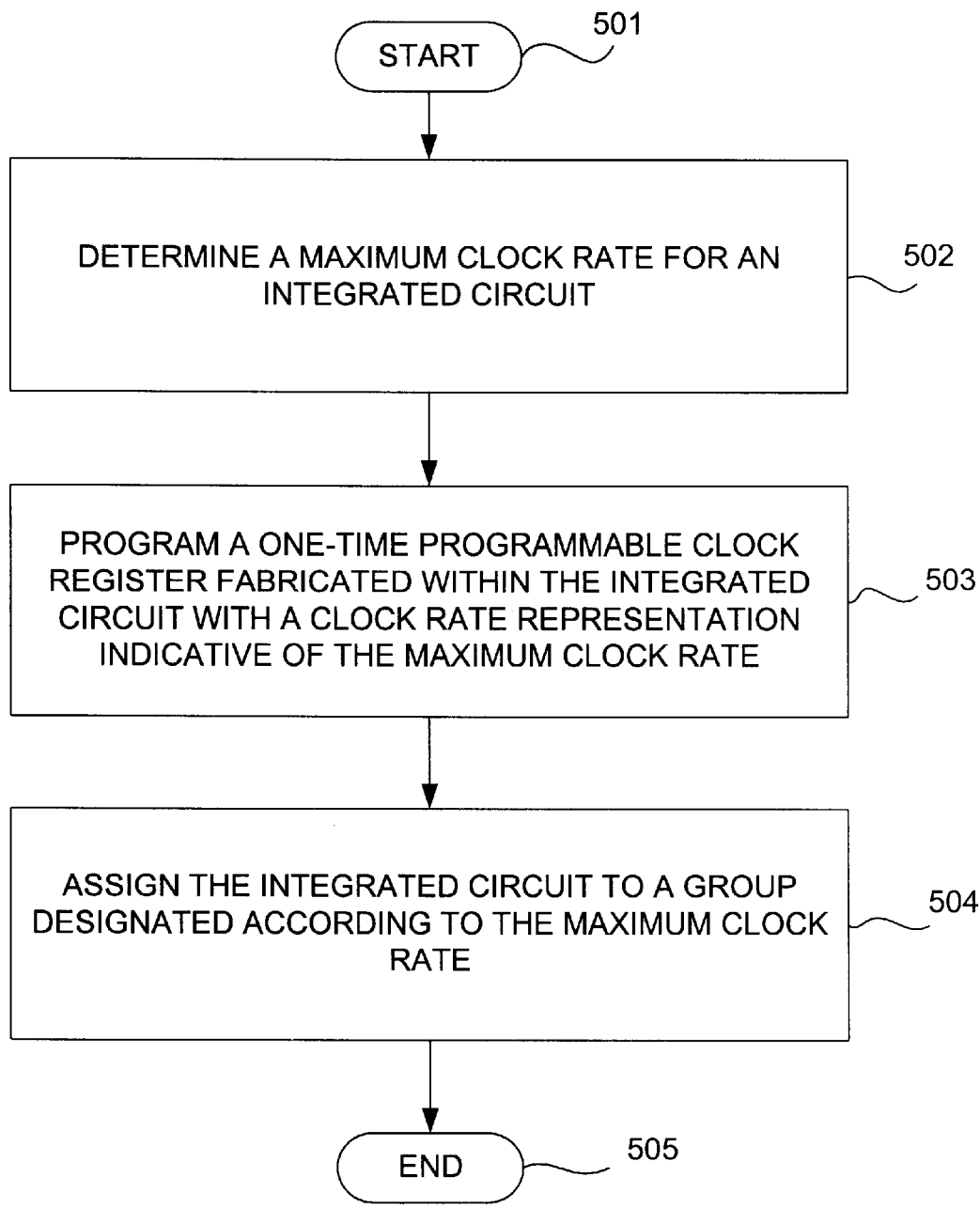
FIG. 5 is a flow diagram illustrating a method according to an embodiment of the present invention.

FIG. 5 is a flow diagram illustrating a method according to an embodiment of the present invention. The method begins in step 501 and continues to step 502. In step 502, a maximum clock rate is determined for an integrated circuit. In step 503, a one-time-programmable clock register fabricated within the integrated circuit is programmed with a clock rate representation indicative of the maximum clock rate. In step 504, the integrated circuit is assigned to a group designated according to the maximum clock rate. The method ends in step 505.

Figure 6:
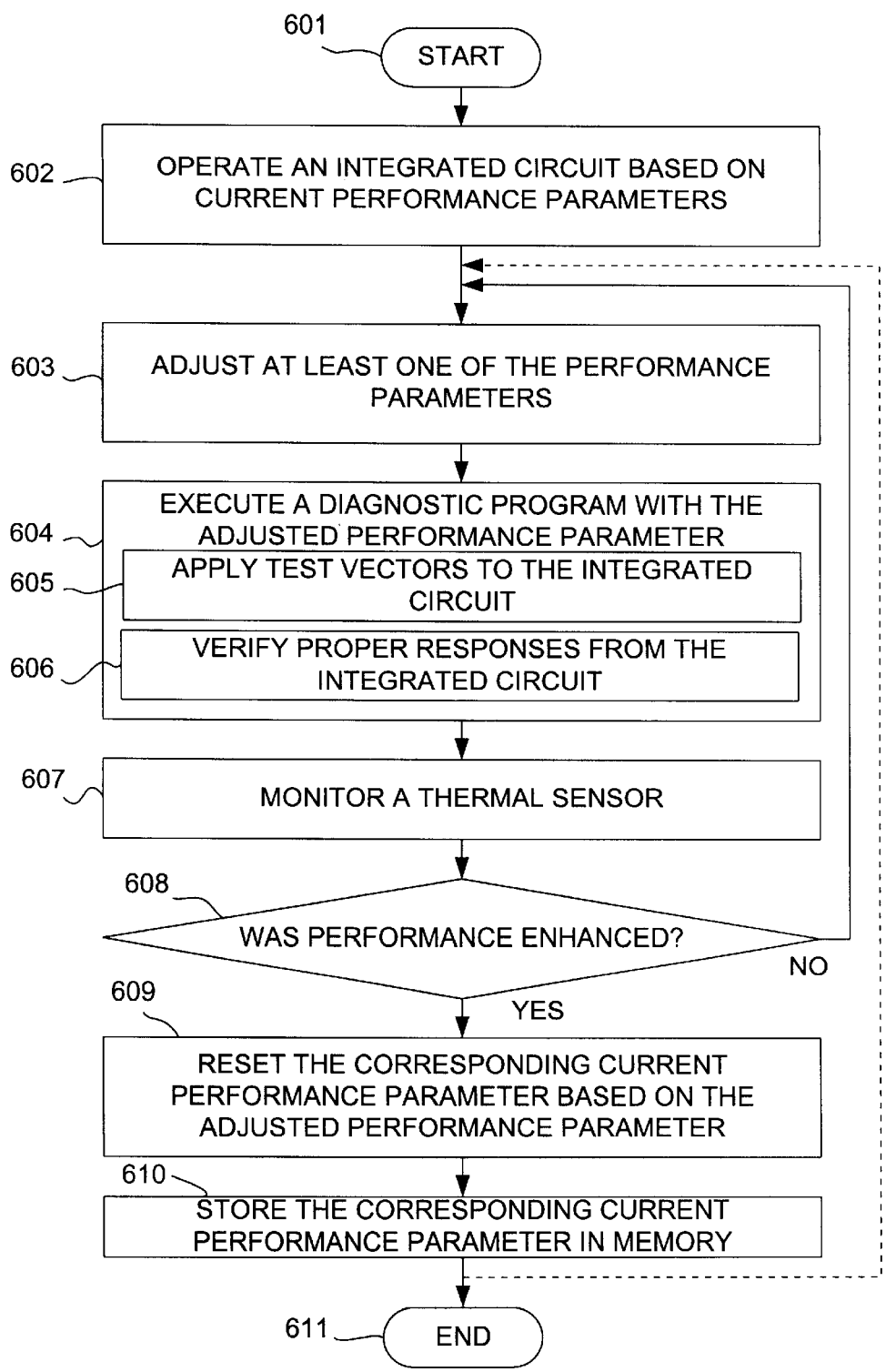
FIG. 6 is a flow diagram illustrating a method according to an embodiment of the present invention.

FIG. 6 is a flow diagram illustrating a method according to an embodiment of the present invention. The method begins in step 601 and continues to step 602. In step 602, an integrated circuit is operated based on current performance parameters. In step 603, at least one of the performance parameters is adjusted. This adjustment may occur from time to time or in response to an event, for example, an indication that the user wishes to initiate the adjustment, a change in battery status, or an indication from an application. For example, the user-programmable register 137 may be used to request such an adjustment. The adjustment may be performed with or without reference to a look-up table stored in memory containing values for performance parameters. The look-up table may include values stored in step 610 during previous iterations of the process or may include other values, for example, pre-programmed values. The process may be performed iteratively until the desired results are achieved.

In step 604, a diagnostic program is executed with at least one of the performance parameters having been adjusted. The diagnostic program may be an internal diagnostic program or an externally administered diagnostic program. The diagnostic program may be executed while the integrated circuit is in a temperature-controlled environment or in an operational environment. Step 604 may also include steps 605 and steps 606. In steps 605, test vectors are applied to a central processing unit core. In step 606, responses from the CPU core are verified. Optionally, step 604 may be omitted.

From step 604, the process continues to step 607. In step 607, a thermal sensor is monitored. By monitoring the thermal sensor, changes in power dissipation may be determined, which may be used to determine whether the performance of the integrated circuit was enhanced. The thermal sensor may be monitored to ensure that the integrated circuit is operating within a specified temperature range. In step 608, a determination is made as to whether the performance of the integrated circuit was enhanced with the adjusted performance parameter. Enhancement of the performance may be determined by comparing the performance with the adjusted performance parameter to the previous performance or to desired performance criteria. For example, if reduced power dissipation is desired, enhanced performance may be indicated by a reduction in power dissipation. If the performance was not enhanced, the process returns to step 603. If the performance was enhanced, the process continues to step 609.

In step 609, the corresponding current performance parameter is reset based on the adjusted performance parameter. In step 610, the corresponding current performance parameter reset in step 609 is stored in memory for future use. The other current performance parameters non reset in step 609 may also be stored for future use. The process ends in step 611 or, alternatively, the process returns to step 603.

Performance enhancement examples include increasing the operating rate, decreasing the operating rate, decreasing power dissipation, etc.

Figure 7:
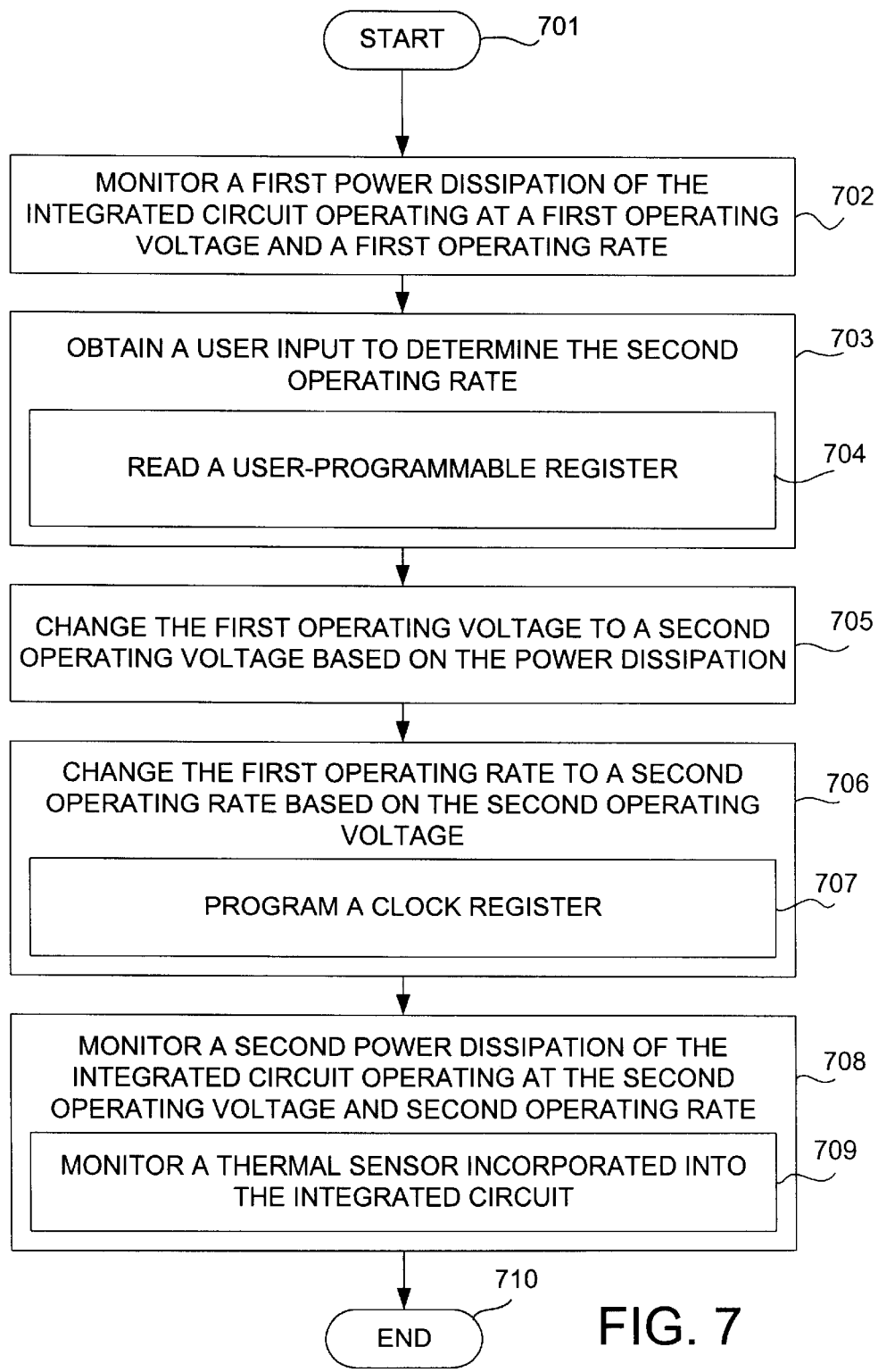
FIG. 7 is a flow diagram illustrating a method according to an embodiment of the present invention.

FIG. 7 is a flow diagram illustrating a method according to an embodiment of the present invention. The method begins in step 701 and continues at step 702. In step 702, a first power dissipation of an integrated circuit operating in a first operating voltage and a first operating rate is monitored. In step 703, a user input is obtained to determine a second operating rate. Step 703 may include step 704. In step 704, a user programmable register is read. From step 703, the method continues in step 705. In step 705, the first operating voltage is changed to a second operating voltage based on the power dissipation.

In step 706, the first operating rate is changed to a second operating rate based on the operating voltage. Step 706 may include step 707. In step 707, a clock register is programmed. From step 706, the process continues to step 708. In step 708, a second power dissipation of the integrated circuit is monitored with the integrated circuit operating at the second operating voltage and the second operating rate. Step 708 may include step 709. In step 709, a thermal sensor, such as a diode junction, incorporated into the integrated circuit is monitored. The thermal sensor may be used to determine the power dissipation. In step 710, the process ends or, alternatively, the process may continue to adjust the operating voltage and operating rate in response to the monitored power dissipation or other criteria.

It should be noted that steps 705 and 706 may be performed in reverse order. Performing step 706 prior to step 705 may be particularly useful if the operating rate of the integrated circuit is being reduced. Since a particular operating voltage may be needed to support a particular operating rate, reducing the operating voltage prior to reducing the operating rate may lead to a temporary condition where the operating voltage is insufficient to support the pre-existing operating rate. By first reducing the operating rate, then reducing the operating voltage, this problem is avoided.

Figure 8:
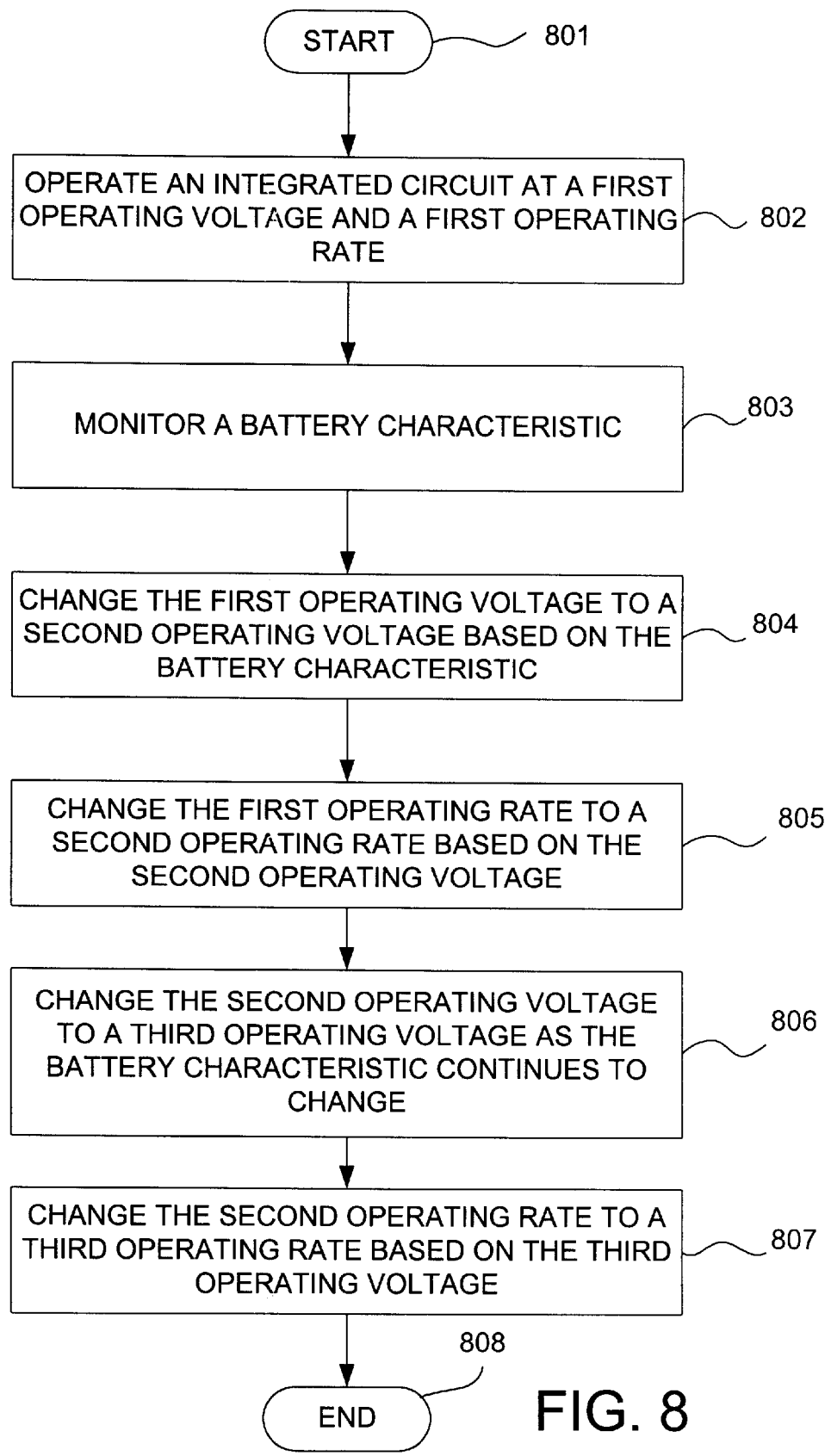
FIG. 8 is a flow diagram illustrating a method according to an embodiment of the present invention.

FIG. 8 is a flow diagram illustrating a method according to an embodiment of the present invention. The method begins in step 801. In step 802, an integrated circuit is operated at a first operating voltage and a first operating rate. In step 803, a battery characteristic representative of battery life, for example, battery voltage, is monitored. In step 804, the first operating voltage is changed to a second operating voltage based on the monitored battery characteristic. In step 805, the first operating rate is changed to a second operating rate based on the second operating voltage. In step 806, the second operating voltage is changed to a third operating voltage as the monitored battery characteristic continues to change. In step 807, the second operating rate is changed to a third operating rate based on a third operating voltage. In step 808, the method ends or, alternatively, the operating voltage and operating rate may continue to be adjusted. As noted above, the order of the steps may be changed, for example, the order of steps 804 and 805 may be reversed, and the order of steps 806 and 807 may be reversed.

Accordingly, a method and apparatus for optimizing production yield and operational performance of integrated circuits has been described. It should be understood that the implementation of other variations and modifications of the invention in its various aspects will be apparent to those of ordinary skill in the art, and that the invention is not limited by the specific embodiments described. For example, aspects of the invention described as being applicable to a CPU may also be applied to other types of integrated circuits. It is therefore contemplated to cover by the present invention, any and all modifications, variations, or equivalents that fall within the spirit and scope of the basic underlying principles disclosed and claimed herein.

What is claimed is:

1. A method for optimizing a yield for production of integrated circuits comprising the steps of:

utilizing a nominal operating voltage to categorize the integrated circuits into a plurality of performance categories;

adjusting the nominal operating voltage for a performance category of the plurality of performance categories to optimize the yield within the performance category.

2. The method of claim 1 wherein the step of utilizing a nominal operating voltage to categorize the integrated circuits into a plurality of performance categories comprises the steps of:

utilizing the nominal voltage to categorize a first subset of the integrated circuits into a first performance category, wherein the integrated circuits categorized in the first performance category are capable of operating at a higher than specified operating rate; and utilizing the nominal voltage to categorize a second subset of the integrated circuits into a second performance category, wherein the integrated circuits categorized in the second performance category are capable of operating at a specified operating rate.

3. The method of claim 2 wherein the step of adjusting the nominal operating voltage for a performance category comprises the steps of:

adjusting a first nominal operating voltage for the first performance category; and adjusting a second nominal operating voltage for the second performance category.

4. The method of claim 3 wherein the step of utilizing a nominal operating voltage to categorize the integrated circuits into a plurality of performance categories further comprises the step of:

utilizing the nominal voltage to categorize a third subset of the integrated circuits into a third performance category, wherein the integrated circuits categorized in the third performance category are capable of operating at a lower than specified operating rate.

5. The method of claim 4 wherein the step of adjusting the nominal operating voltage for a performance category further comprises the step of:

adjusting a third nominal operating voltage for the third performance category.

6. The method of claim 1 wherein the step of utilizing a nominal operating voltage to categorize the integrated circuits into a plurality of performance categories comprises the step of:

utilizing a nominal operating voltage to categorize the integrated circuits into a plurality of performance categories based on a maximum operating rate of each of the integrated circuits.

7. The method of claim 6 further comprising the step of:

fixing a first operating rate for a first subset of the integrated circuits categorized within a first performance category of the plurality of performance categories.

8. The method of claim 7 wherein the step of fixing the first operating rate comprises the step of:

programming a one-time-programmable device.

9. The method of claim 8 further comprising the step of:

fixing a second operating rate for a second subset of the integrated circuits categorized within a second performance category of the plurality of performance categories.

* * * * *